(12) United States Patent
Lee

(10) Patent No.: US 7,391,619 B1
(45) Date of Patent: Jun. 24, 2008

(54) LATCH FOR INTERFACE CARD

(75) Inventor: Ching-Yao Lee, Banciao (TW)

(73) Assignee: T-Conn Precision Corp.

( * ) Notice: Subject to any disclaimer, the term of this patent is extended or adjusted under 35 U.S.C. 154(b) by 0 days.

(21) Appl. No.: 11/855,365

(22) Filed: Sep. 14, 2007

(51) Int. Cl.
*H05K 7/12* (2006.01)

(52) U.S. Cl. .................. 361/759; 361/726; 361/732; 361/740; 361/747; 361/801; 439/325; 439/328; 439/326

(58) Field of Classification Search .............. 361/726, 361/732, 740, 747, 759, 801, 742, 804; 439/325–328
See application file for complete search history.

(56) References Cited

U.S. PATENT DOCUMENTS

| 5,123,857 | A | * | 6/1992 | Lee Chao | 439/326 |
| 5,154,627 | A | * | 10/1992 | Lee | 439/326 |
| 5,286,217 | A | * | 2/1994 | Liu et al. | 439/326 |
| 5,340,328 | A | * | 8/1994 | Lee | 439/326 |
| 5,372,518 | A | * | 12/1994 | Liu et al. | 439/326 |
| 5,395,262 | A | * | 3/1995 | Lwee | 439/326 |
| 6,971,899 | B1 | * | 12/2005 | Liu | 439/326 |
| 7,077,678 | B1 | * | 7/2006 | Korsunsky et al. | 439/326 |
| 7,085,141 | B2 | * | 8/2006 | Yi | 361/804 |
| 7,134,895 | B1 | * | 11/2006 | Choy et al. | 439/326 |
| 7,134,896 | B1 | * | 11/2006 | Chen | 439/326 |
| 7,300,299 | B2 | * | 11/2007 | Wang | 439/326 |

\* cited by examiner

*Primary Examiner*—Dean A. Reichard
*Assistant Examiner*—Dameon E. Levi
(74) *Attorney, Agent, or Firm*—Morris Lin; T-Conn Precision Corp.

(57) ABSTRACT

A structure of a latch for an interface card is provided. The latch has a base plate including a plurality of pins formed on two sides thereof, a horn and a spring portion. The spring portion has a supporting portion with an inclined face at a frontal side thereof, and a wing and a block respectively formed at two sides thereof. The wing and the supporting portion are bent towards opposite sides, and said spring portion has a protrusion.

1 Claim, 4 Drawing Sheets

US 7,391,619 B1

LATCH FOR INTERFACE CARD

This application claims the priority benefit of Taiwan patent application serial No. 96122808 filed on Jun. 23, 2007

BACKGROUND OF THE INVENTION

1. Field of the Invention

The present invention is related to a latch for an interface card applied in the electronic appliances, computer and the electronic devices.

2. Description of Related Art

The advancement of technology has made the electronic device smaller, thinner and lighter with varieties to fit the requirement of the market, and for providing more convenience to the user to carry, the manufacturers have improved the efficiency and the size of the products consistently.

For contenting more operation efficiency in a smaller body with easy assembly of the computer and the electronic device, the specification and the structure of the components have significant modification thereby.

However, the hardware functions and the space of the computer are limited, thus the multilayer interface slot is available to overcome the problem of space limitation, as shown in FIG. 1. The connectors 20 are positioned with raising heights to prevent the interruption occurred at the frontage of the connector 20 to affect receiving the interface cards 30 and 30a.

The present available latch 10 only fits for receiving the single layer or the first layer interface card 30, but the interface card 30a on the upper layer or the second layer.

SUMMARY OF THE INVENTION

Accordingly, the present invention provides a structure of a latch with more mobility and suitable for any height of the interface card.

For fitting various requirements of components in the market and reducing the cost, the present invention provides a metallic plate that can be bended to fit the height of the interface card.

According to an embodiment of the present invention, a metallic stamping plate that can be bent to form the latch for fitting the interface cards with various heights.

The above metallic plate is stamped to form a base plate, a spring portion, a buckling element having an inclined face, a supporting portion and a horn.

BRIEF DESCRIPTION OF THE DRAWING

For a more complete understanding of the present invention, reference will now be made to the following detailed description of preferred embodiments taken in conjunction with the following accompanying drawings.

DESCRIPTION OF THE EMBODIMENTS

Figure 1:
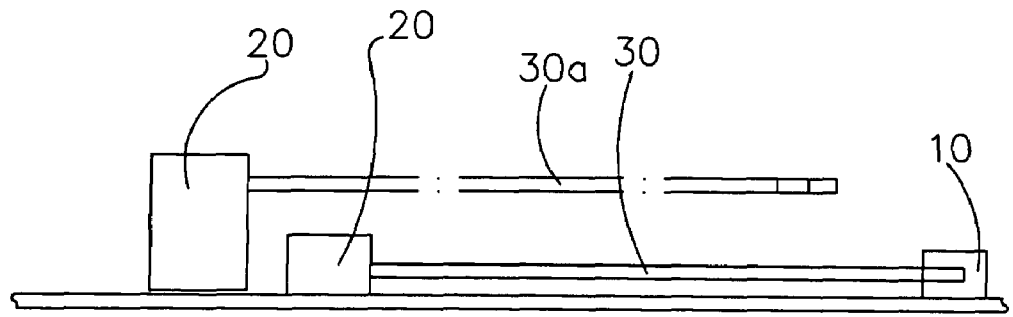
FIG. 1 is a layout of a multilayer interface card according to an embodiment of the present invention.
Figure 2:
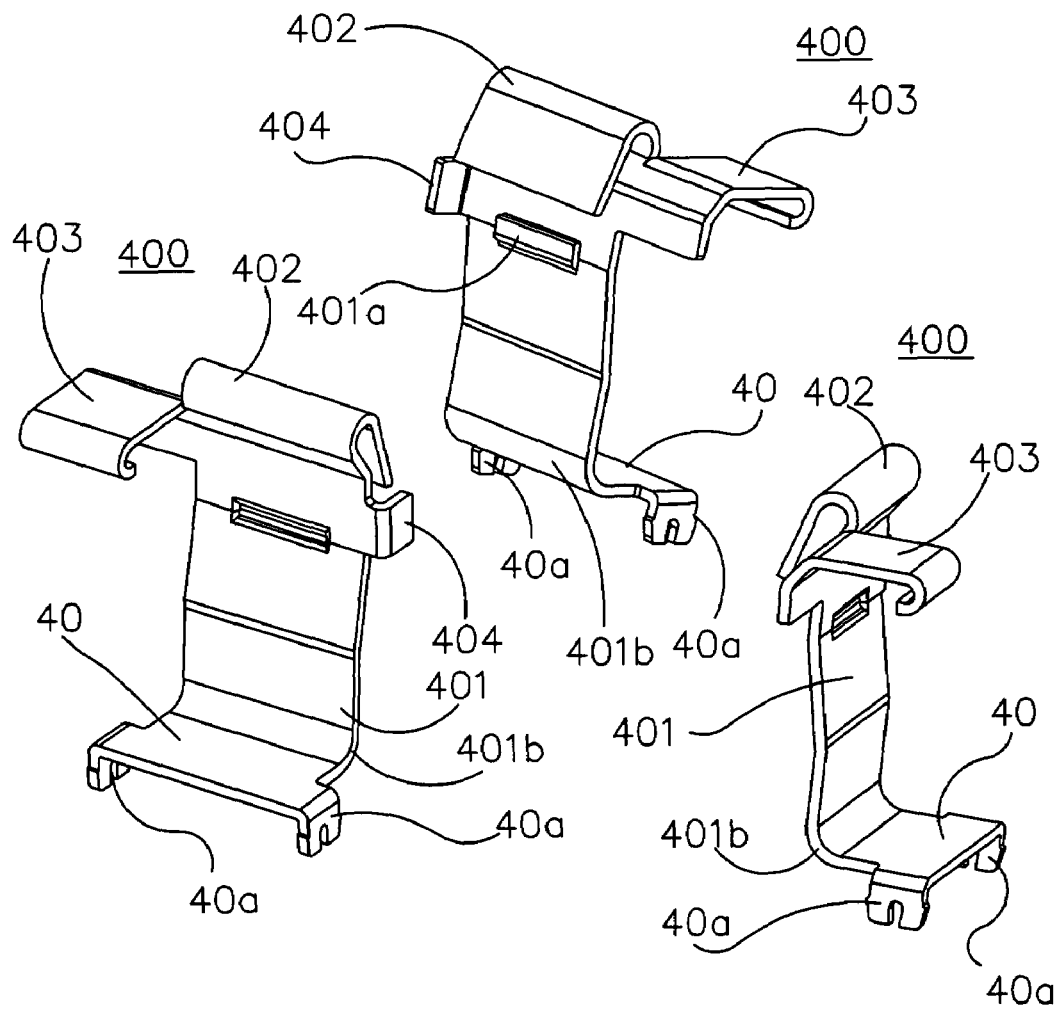
FIG. 2 is a perspective view of a latch according to an embodiment of the present invention.
Figure 3:
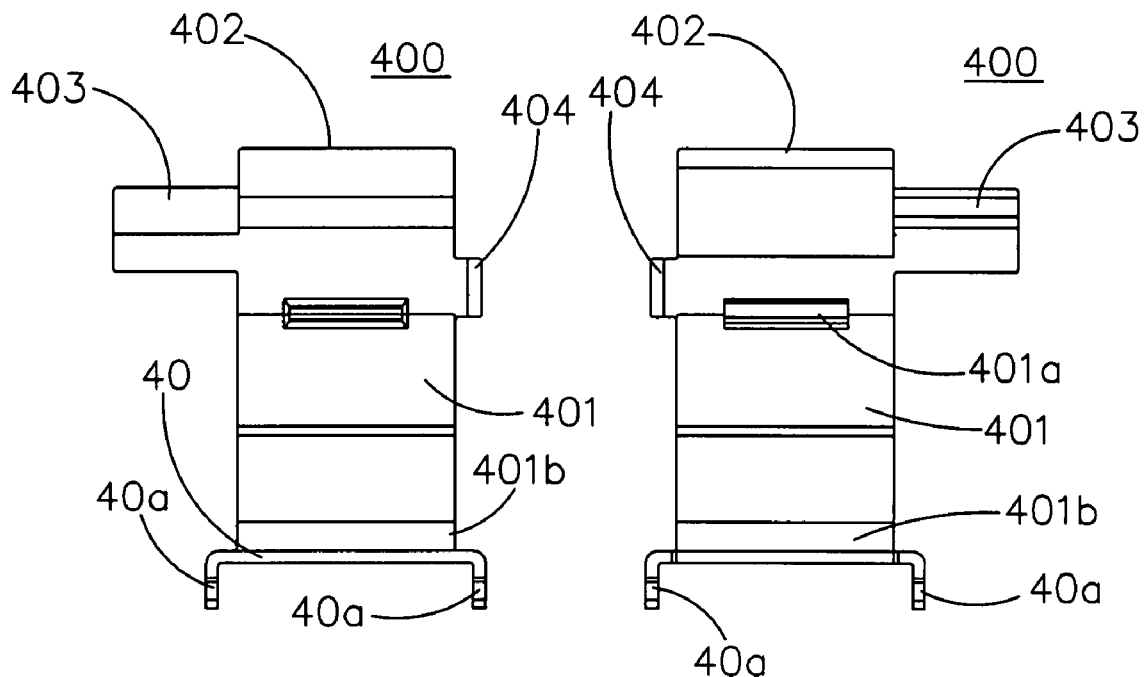
FIG. 3 is a perspective view of a frontage and a rear of a latch according to an embodiment of the present invention.
Figure 4:
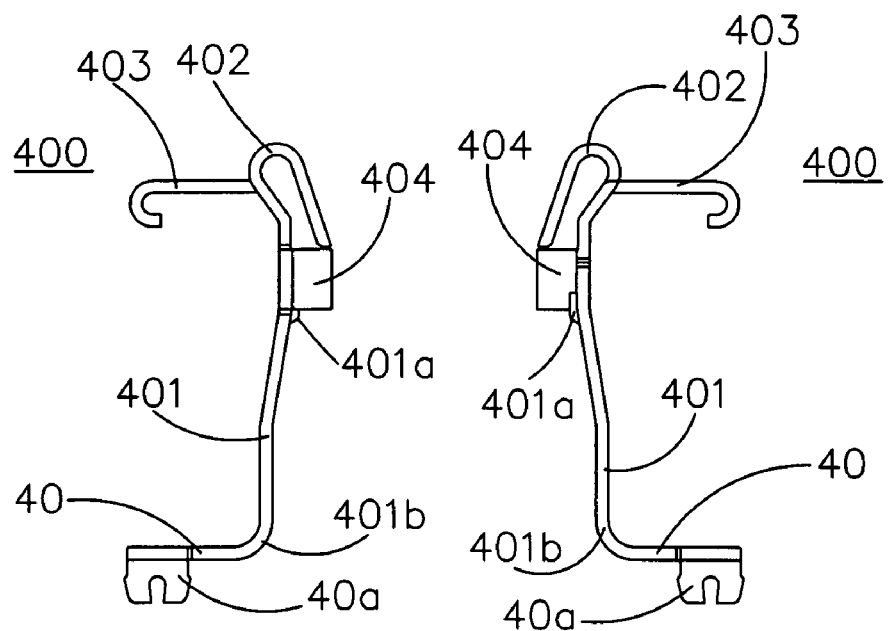
FIG. 4 is a perspective view of two sides of a latch according to an embodiment of the present invention.

FIG. 2 is a perspective view of a latch according to an embodiment of the present invention. Referring to FIG. 2, the positioning device 400 (also refer to FIGS. 3 and 4) comprises a base plate 40 formed by a bent stamped metallic plate comprising pins 40a formed on two sides thereof, a horn 401b and a spring portion 401. The spring portion 401 has a supporting portion 402 with an inclined face at a frontal side thereof, and a wing 403 and a block 404 formed respectively at the two sides thereof. The wing 403 and the supporting portion 402 are bent towards the opposite side. The spring portion 401 has a protrusion 401a.

Figure 5:
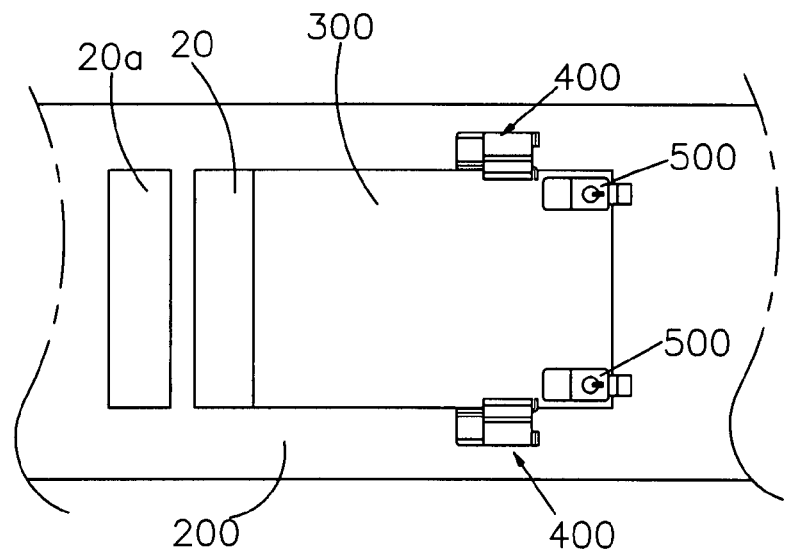
FIG. 5 is a top view showing the operation of the latch according to an embodiment of the present invention.
Figure 6:
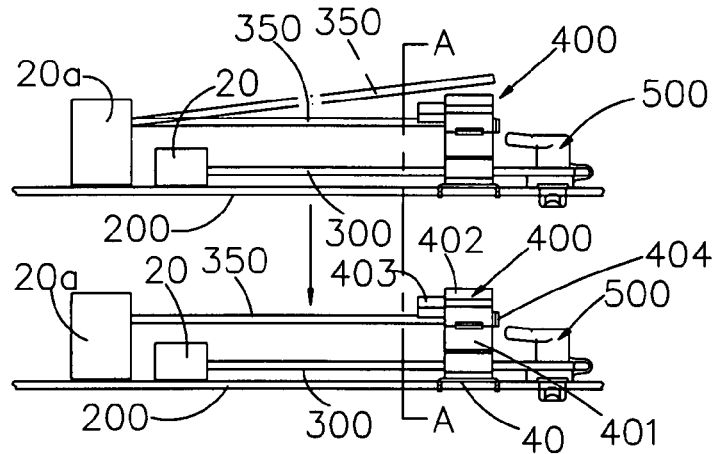
FIG. 6 is a side view showing the operation of the latch according to an embodiment of the present invention.
Figure 7:
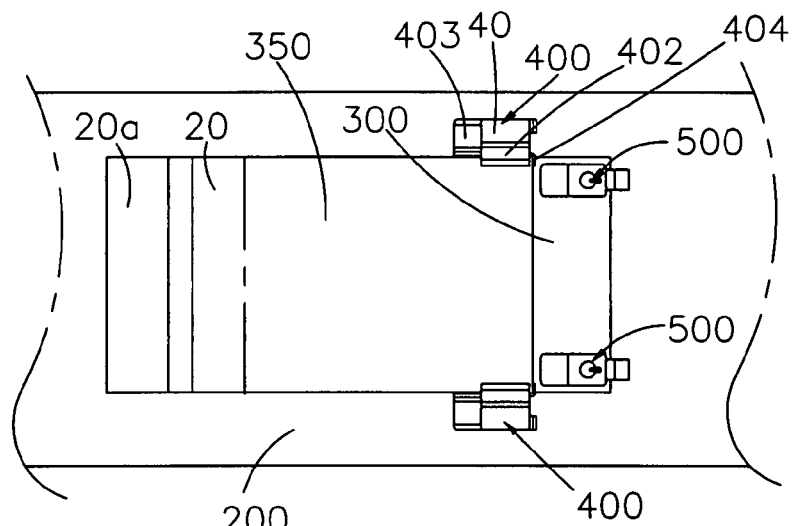
FIG. 7 is a top view showing the receiving of the interface B in the latch according to an embodiment of the present invention.
Figure 8:
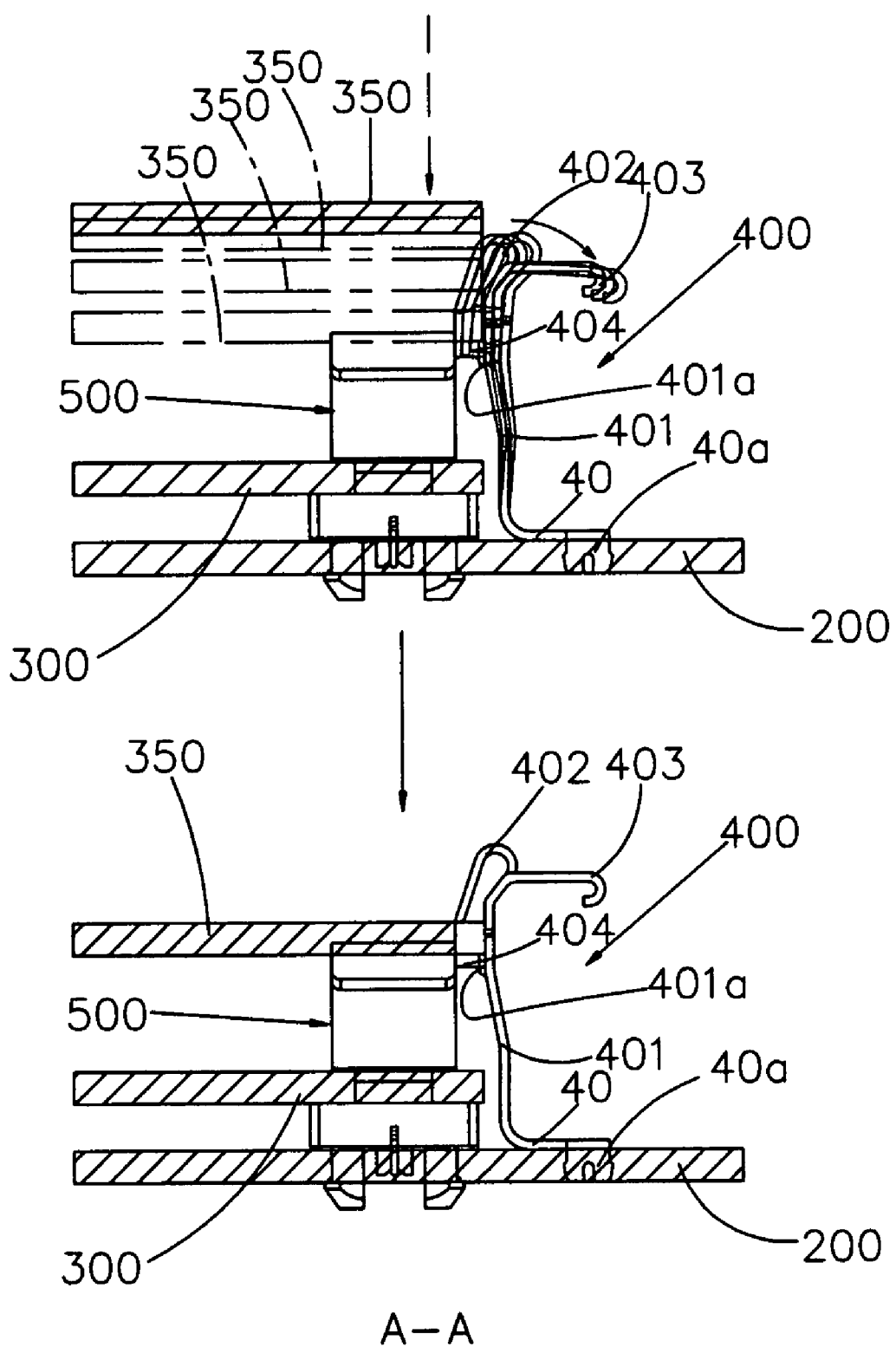
FIG. 8 is a sectional side view of latch taken along line A-A of FIG. 7.

FIGS. 5, 6 and 7 show a top view and a side view showing operation of the latch according to an embodiment of the present invention and a top view showing the receiving of the interface B according to an embodiment of the present invention. Referring to FIGS. 5, 6 and 7, a connector A 20, a connector B 20a and a conventional positioning structure 500 corresponding to connector A 20 are positioned on the board 200. The board 200 comprises slot to secure the positioning device 400. To fit an interface card A 300 into the connector A 20, the connector A 20 is pressed to be securely positioned by the positioning structure 500. Furthermore, to fit an interface card B 350 into the connector B 20a, interface card B 350 is pressed at the distal end thereof (FIG. 8), to make the two sides of the distal end of the interface card B 350 support against the inclined faces of the two supporting portions 402 of the positioning device 400, further to push the two supporting portions 402 to form the outward axial displacement by the elasticity of the spring portion 401 and the horn 401b. Thus, a space for the interface card B 350 to position horizontally may be obtained. The two supporting portions 402 is restored by the elasticity of the spring portion 401 and the horn 401b to enable the supporting portion 402 to support the interface card B 350 accordingly. The protrusion 401a of the spring portion 401 and a block 404 facilitate to position the bottom side of the interface card B 350 and to support against the distal corner of the interface card B 350 for positioning securely.

Accordingly, the positioning device 400 substantially positions the interface card B 350 on the upper layer securely.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A structure of a latch for an interface card, comprising:
a base plate, comprising a plurality of pins formed on two sides thereof, a horn and a spring portion, wherein said spring portion comprises a supporting portion having an inclined face at a frontal side thereof, and a wing and a block respectively formed at two sides thereof, and wherein said wing and said supporting portion are bent towards opposite sides, and said spring portion comprises a protrusion.

* * * * *